United States Patent
Lee et al.

(10) Patent No.: US 11,205,728 B2
(45) Date of Patent: Dec. 21, 2021

(54) VERTICAL FIELD EFFECT TRANSISTOR WITH REDUCED PARASITIC CAPACITANCE

(71) Applicant: International Business Machines Corporation, Armonk, NY (US)

(72) Inventors: Choonghyun Lee, Rensselaer, NY (US); Alexander Reznicek, Troy, NY (US); Xin Miao, Slingerlands, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 16/421,418

(22) Filed: May 23, 2019

(65) Prior Publication Data

US 2020/0373434 A1    Nov. 26, 2020

(51) Int. Cl.
| | |
|---|---|
| *H01L 29/66* | (2006.01) |
| *H01L 29/786* | (2006.01) |
| *H01L 29/423* | (2006.01) |
| *H01L 29/10* | (2006.01) |
| *H01L 21/22* | (2006.01) |
| *H01L 29/51* | (2006.01) |

(52) U.S. Cl.
CPC ........ *H01L 29/78642* (2013.01); *H01L 21/22* (2013.01); *H01L 29/1037* (2013.01); *H01L 29/42364* (2013.01); *H01L 29/512* (2013.01); *H01L 29/6656* (2013.01); *H01L 29/66742* (2013.01)

(58) Field of Classification Search
CPC .......... H01L 29/6656; H01L 29/66666; H01L 29/7827; H01L 29/78642; H01L 21/823487
See application file for complete search history.

(56) References Cited

U.S. PATENT DOCUMENTS

| | | |
|---|---|---|
| 9,373,703 B2 | 6/2016 | Kim et al. |
| 9,773,708 B1 | 9/2017 | Zhang et al. |
| 9,853,028 B1 | 12/2017 | Cheng et al. |
| 9,859,166 B1 | 1/2018 | Cheng et al. |

(Continued)

*Primary Examiner* — Mark V Prenty
(74) *Attorney, Agent, or Firm* — Erik Johnson; Lou Percello, Attorney, PLLC

(57) ABSTRACT

A vertical field effect transistor (VFET) has a top source/drain (S/D) with a first region having a first area and a first capacitance and a second region having a second area and a second capacitance. A first top spacer on a gate cross section area. A second top spacer with a varying thickness is disposed the first top spacer. Both the first and second top spacers are between the top S/D and the gate cross section area. Due to the varying thickness of the second spacer with the smaller thickness closer to the fin, the separation distance between the larger, first area and the gate cross section area is greater than the separation distance between the smaller, second area and the gate cross section area. Therefore, the first capacitance is reduced because of the larger separation distance and the second capacitance is reduced because of the smaller second area. The smaller thickness of the second top spacer being closer to the fin allows dopants to diffuse a shorter distance when forming a junction between the top S/D and the channel of the VFET.

13 Claims, 14 Drawing Sheets

(56) References Cited

U.S. PATENT DOCUMENTS

| | | |
|---|---|---|
| 9,882,025 B1 | 1/2018 | Zhang |
| 9,899,515 B1 * | 2/2018 | Cheng .................. H01L 27/088 |
| 9,935,195 B1 | 4/2018 | Xu et al. |
| 9,941,378 B2 | 4/2018 | Basker et al. |
| 10,833,155 B2 * | 11/2020 | Yeh .................. H01L 21/76224 |
| 2017/0110558 A1 | 4/2017 | Lee et al. |
| 2017/0317211 A1 | 11/2017 | Kim |
| 2018/0061993 A1 | 1/2018 | Nimi et al. |

* cited by examiner

VERTICAL FIELD EFFECT TRANSISTOR WITH REDUCED PARASITIC CAPACITANCE

BACKGROUND

The present invention generally relates to semiconductor device structures and methods of manufacturing. More particularly, the invention relates to the vertical field effect transistors (VFETs) with reduced parasitic capacitance.

Vertical field effect transistors (VFETs) are becoming viable device options for semiconductor devices below 7 nanometer (nm) technology nodes. VFET devices include fin channels with source/drain regions on the top and bottom ends of the fin channel. Current runs through the fin channels in a vertical direction (e.g., perpendicular to a substrate), for example, from a bottom source/drain (S/D) region to a top source/drain (S/D) region.

As the VFETs shrink in size, components of the VFETs come closer together which increases parasitic capacitance within the device. For example, as the distance separating the top S/D and the gate decreases the resulting parasitic capacitance increases. Efforts to reduce the capacitance by moving these components apart is difficult because the top S/D and gate should be close enough together to allow dopant diffusion to form the junction between the channel and top S/D during device manufacturing.

Further, due to decreasing space within the VFET, epitaxial growth of the top S/D in the VFET is not a self-limited diamond shape but a confined epitaxial growth. A top S/D having a confined epitaxial growth increases the parasitic coupling capacitance between the gate and the top S/D.

The prior art uses low-k dielectric materials as a spacer to separate the top S/D and the gate. However, most of the low-k dielectric materials include oxygen (e.g. SiCO, SiCON, SiBCON, etc.) that result in growth of an interfacial layer on the channel through the gate structure that causes a shift in the threshold voltage, Vth, of the device and degradation of device performance.

SUMMARY

Embodiments of the present invention include devices, uses, and methods of making a VFET with reduced parasitic capacitance.

Some embodiments of a vertical field effect transistor (VFET) are disclosed. The VFET has a bottom source/drain (S/D); a fin having a vertical channel, a fin top, and a fin bottom (where the fin bottom is connected to the bottom S/D); a gate encompassing the channel, the gate having a cross section area; a first top spacer with a first, constant thickness made of a material containing no oxygen disposed on the gate cross section area; a second top spacer with a second, varying thickness disposed on the first top spacer; and a top S/D disposed on the second top spacer. The top S/D has a first region with a first area and a first capacitance and a second region with a second area and a second capacitance. Due to the varying thickness of the second spacer with the smaller thickness closer to the fin, the separation distance between the larger, first area and the gate cross section area is greater than the separation distance between the smaller, second area and the gate cross section area. Therefore, the first capacitance is reduced because of the larger separation distance and the second capacitance is reduced because of the smaller second area. The smaller-thickness, second top spacer being nearer to the gate allows dopants to diffuse a shorter distance into the fin when forming a junction between the top S/D and the channel of the VFET.

Methods of making and using the device are disclosed.

BRIEF DESCRIPTION OF THE DRAWINGS

Various embodiments of the present invention will be described below in more detail, with reference to the accompanying drawings, briefly described below. The Figures show various structures and related method steps.

DETAILED DESCRIPTION

Figure 1:
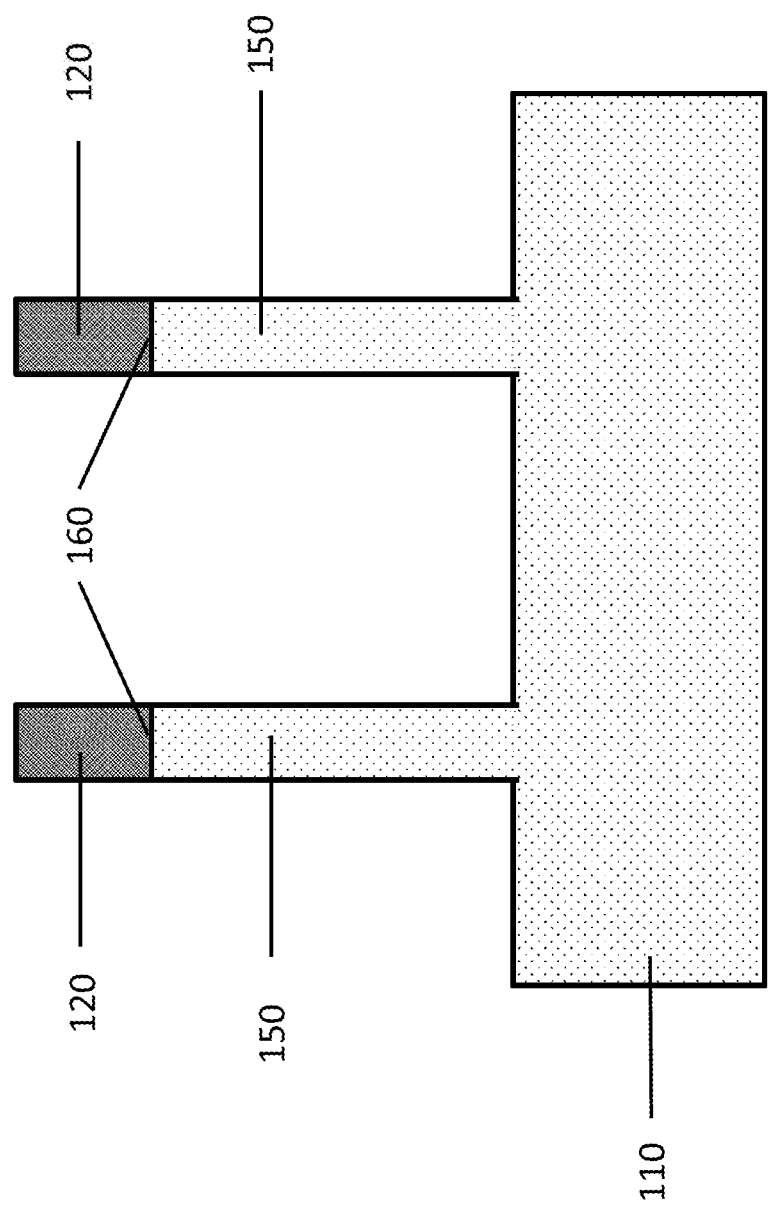
FIG. 1 is an elevation cross section view of an initial structure for a VFET showing fin formation.

It is to be understood that embodiments of the present invention are not limited to the illustrative methods, apparatus, systems and devices disclosed herein but instead are more broadly applicable to other alternative and broader methods, apparatus, systems and devices that become evident to those skilled in the art given this disclosure.

In addition, it is to be understood that the various layers and/or regions shown in the accompanying drawings are not drawn to scale, and that one or more layers and/or regions of a type commonly used in a, for example, field-effect transistor (FET), FinFET, VFET, CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used, herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

With reference to the figures, FIG. 1 is an elevation cross section view of one initial structure 100 for a VFET showing fin 150 formation. A hard mask 120 is deposited on the top end of each fin (fin end 160). In an embodiment, the fins 150 are perpendicular to the substrate 110.

In an embodiment, the substrate 110 is made of bulk semiconductor material including, but not limited to, silicon (Si), Si alloys, carbon doped silicon (Si:C), germanium (Ge), Ge alloys, silicon germanium (SiGe), carbon doped silicon germanium (SiGe:C), III-V compound semiconductors, II-V compound semiconductors, gallium arsenide (GaAs), cadmium telluride (CdTe), zinc selenide (ZnSe), or other like semiconductors. In addition, multiple layers of the semiconductor materials can be used.

Alternatively, the substrate 110 can be a semiconductor-on-insulator substrate such as, but not limited to, a silicon-on-insulator (SOI), silicon-germanium-on-insulator (SGOI), or III-V-on-insulator substrate including a buried insulating layer, such as, for example, a buried oxide, nitride layer or aluminum oxide.

In some embodiments, a hard mask layer is deposited on the substrate 110. Then the fins 150 are formed by patterning the substrate 110 with the hard mask layer 120. Thus, the fins 150 are formed of the same material as the substrate 110.

In some embodiments, the fins 150 and substrate 110 are made of silicon.

Each of the fins 150 may have a width or horizontal thickness in the range of 5 nanometers (nm) to 10 nm, although other widths above or below this range may be used as desired for a given application. Each of the fins 150 may have a height or vertical thickness (in direction perpendicular to the substrate 110) ranging from 30 nm to 150 nm, although other heights above or below this range may be used as desired for a given application. A spacing between adjacent fins 150 may be in the range of 20 nm to 100 nm, although other spacing may be used as desired for a given application.

The hard mask 120 is a protective, dielectric material, e.g. a lithographic protective material, including but not limited to any one of the following materials: silicon nitride (SiN), siliconborocarbonitride (SiBCN), silicon oxycarbonitride (SiOCN), and silicon oxynitride (SiON).

In an embodiment, the hard mask 120 is SiN or SiBCN.

Figure 2:
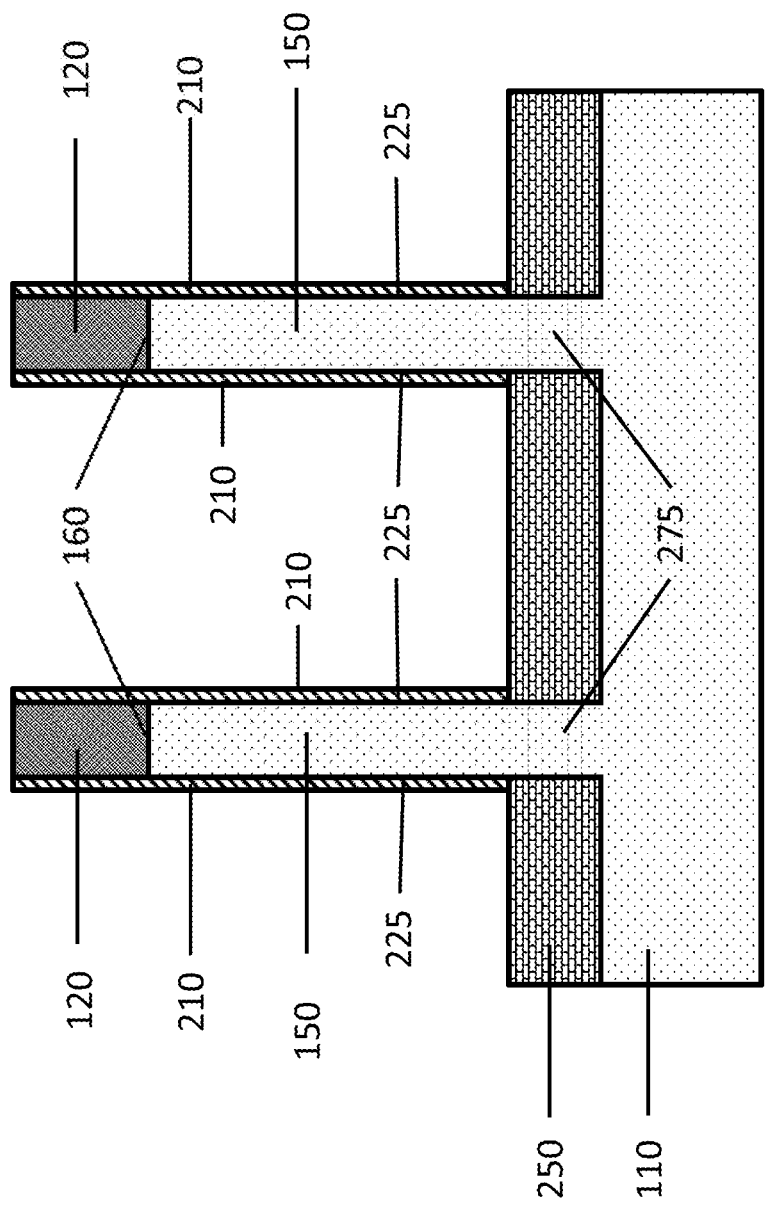
FIG. 2 is an elevation cross section view of an interim structure for a VFET showing a deposition of a fin liner and a grown bottom S/D.

FIG. 2 is an elevation cross section view of an interim structure 200 for a VFET showing a fin liner 210 deposited on the sides of the fins 150 and hard mask 120 and the formation of a bottom S/D 250.

The fin liner 210 is deposited to protect epitaxial growth on the sides of the fins 150 (fin sides 225) during the growth of the bottom S/D 250. To form the fin liner 210, the fin liner 210 material is conformally deposited on every surface of the structure 200, e.g. horizonal surface of the substrate, fin end 160, fin sides 225, etc. The thickness of the applied fin liner 210 conformal layer is between 2 to 5 nanometers (nm). Then, in some embodiments, a directed, top-down RIE removes the fin liner 210 material from the horizontal surfaces of the structure 200 but leaves the fin liner 210 on the fin sides 225. After performing the directed, top-down RIE, the top surface of the substrate 110 and the tops of the hard masks 120 are exposed.

The fin liner 210 can be any dielectric material that is selectively removable by processes that do not affect the materials making up the substrate 110, fins 150, and hard mask 120. In an embodiment, the fin liner 210 is SiO2 or a bilayer of SiO2 and SiN.

The fin liner 210 can be deposited by any of the following processes: atomic layer deposition (ALD), chemical vapor deposition (CVD), Plasma Enhanced Chemical Vapor Deposition (PECVD), Radio Frequency Chemical Vapor Deposition (RFCVD), Physical Vapor Deposition (PVD), Pulsed Laser Deposition (PLD), Liquid Source Misted Chemical Deposition (LSMCD), and/or sputtering.

The substrate 110 surface is etched back to recess the horizontal surface of the substrate 110 between 20 to 40 nm. The etch back can be performed by the directed, top-down RIE, or wet chemistry, or a combination of both.

The etch back will expose the fin 150 bottoms below the fin liner 210. The bottom S/D 250 is then epitaxially grown. The bottom S/D 250 surrounds the fin bottom 275 side surface during the epitaxial growth and the bottom S/D 250 becomes electrically, physically, and chemically attached to the fin bottom 275.

The doping of the bottom S/D 250 is dependent on whether the device is a P-VFET or an N-VFET. Dopants may include, for example, a p-type dopant (for a P-VFET) selected from a group of boron (B), gallium (Ga), indium (In), and thallium (Tl). An n-type dopant (for an N-VFET) is selected from a group of phosphorus (P), arsenic (As) and antimony (Sb). In a non-limiting example, the bottom S/D is highly doped with a dopant concentration range between $4 \times 10^{20}$ cm$^{-3}$ and $2.5 \times 10^{21}$ cm$^{-3}$.

In an embodiment, the bottom S/D 250 is doped with boron (B) for the P-VFET and phosphorous (P) for the N-VFET.

Figure 3:
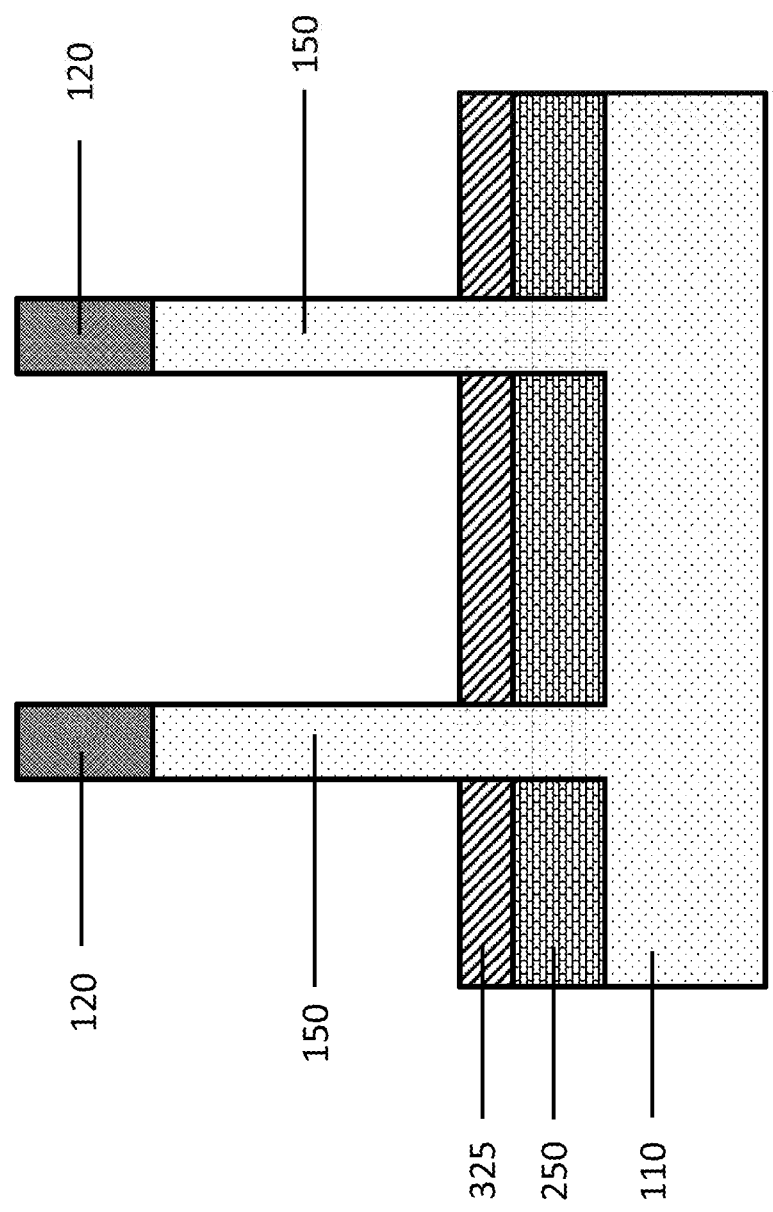
FIG. 3 is an elevation cross section view of an interim structure for a VFET showing a formed bottom spacer.

FIG. 3 is an elevation cross section view of one interim structure 300 for a VFET showing a formed bottom spacer 325.

In an embodiment, bottom spacer 325 is deposited using a non-conformal deposition, e.g. a high-density plasma (HDP) deposition followed by an etch-back process. This process provides a thicker film deposition on the horizontal surfaces (e.g., on the bottom S/D 250) and a thin deposition (not shown) on the vertical sides, e.g. fin sides 225 along with sides of the hard mask 120. The thin deposition on the vertical sides and on top of the hard mask 120 is removed by the etch back step. A wet etch back process can be used.

The non-conformal deposition initially leaves about a 10 nm thickness on the horizontal surfaces, the bottom spacer 325 and the top of the hard mask 120. There initially is about a 2-3 nm thickness on the vertical sign areas. The etch back step removes the 2-3 nm thickness from the horizontal and vertical surfaces leaving no spacer material on the vertical surfaces and a bottom spacer 325 with a final thickness in the 2 to 8 nm range. The bottom spacer 325 thickness can be about 6 nm. The spacer material on the top horizontal surface of the hard mask is removed because the fin 150 thickness/width is between 5 to 10 nm and the spacer material on the top of the hard mask is etched away from both the sides and top.

In some embodiments, the spacer 325 is a low-k dielectric, including but not limited to: dielectric nitrides (e.g., SiN), silicon boron nitride (SiBN), SiBCN, SiOCN, or silicon oxide.

Figure 4:
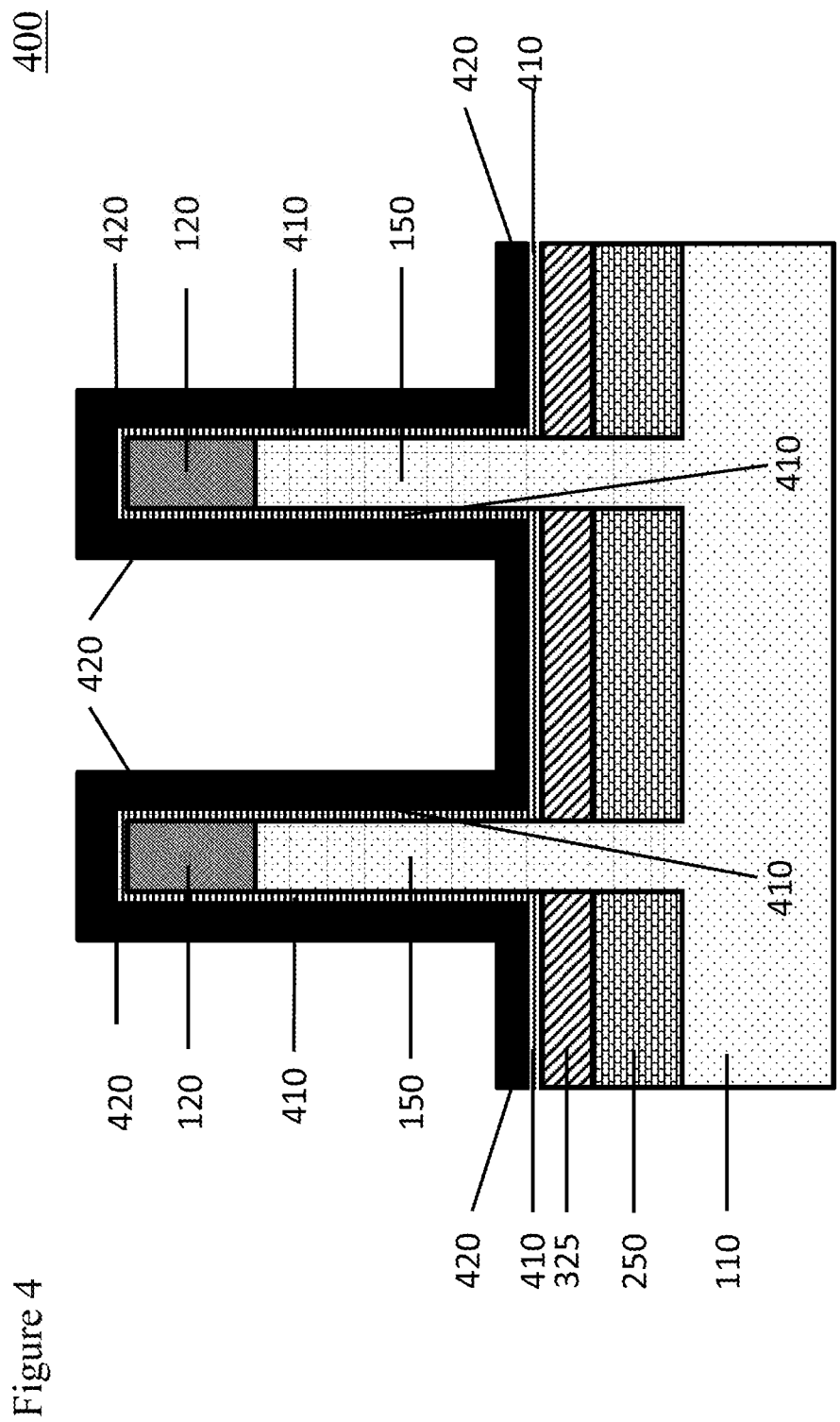
FIG. 4 is an elevation cross section view of an interim structure for a VFET after conformally depositing a high-k layer and a work function metal layer.

FIG. 4 is an elevation cross section view of an interim structure 400 for a VFET after conformally depositing a high-k layer 410 and a work function metal layer 420.

In some embodiments, the high-k dielectric material 410 is conformally deposited all over the surface of 400 by Atomic Layer Deposition (ALD) at a thickness of about 2 nm. The conformally deposition of the high k dielectric material 410 renders the same thickness of high k dielectric material 410 on the horizontal and vertical surfaces. Alternative deposition techniques include but are not limited to: chemical vapor deposition (CVD), plasma enhanced CVD (PECVD), radio frequency CVD (RFCVD), physical vapor deposition (PVD), pulsed laser deposition (PLD), liquid source misted chemical deposition (LSMCD), and/or sputtering.

In some embodiments, the high-k dielectric materials 410 are an oxide, a nitride, and/or an oxynitride. In some embodiments, the high-k dielectric materials 410 have a dielectric constant greater than 4.0. Embodiments of high k dielectrics 410 include, but are not limited to: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x can vary independently from 0.5 to 3 and each value of y can vary independently from 0 to 2. In some embodiments, a multilayered dielectric structure 410 comprising different dielectric materials, e.g., silicon dioxide and a high-k gate dielectric, can be formed.

After the high k dielectric material 410 is deposited, a work function metal layer 420 can be conformally deposited over the high-k dielectric material 410 layer. Upon device completion, the remaining high-k dielectric material 410 (around and on the channel region of the fins 150) will comprise the gate dielectric and the remaining work function material (around and on the channel region) will comprise the metal gate.

While the high-k dielectric material 410 can be the same for both the P-VFET and N-VFET structures, the work function material 420 for the P-VFET structures will be different than the work function material 420 for the N-VFET structures.

The p-type work function metal layer 420 materials include but are not limited to: titanium nitride (TiN), tantalum nitride (TaN) or ruthenium (Ru). These work function metals 420 are deposited using deposition techniques including, but not limited to: Chemical Vapor Deposition (CVD), Plasma Enhanced Chemical Vapor Deposition (PECVD), Radio Frequency Chemical Vapor Deposition (RFCVD), Physical Vapor Deposition (PVD), Atomic Layer Deposition (ALD), Pulsed Laser Deposition (PLD), Liquid Source Misted Chemical Deposition (LSMCD), and/or sputtering.

The n-type work function metal 420 materials include, but are not limited to: TiN, titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN. These work function metal materials 420 can be deposited in the same manner as the p-type work function metals 420.

In an embodiment, the work function metal 420 is deposited by an ALD process.

Figure 5:
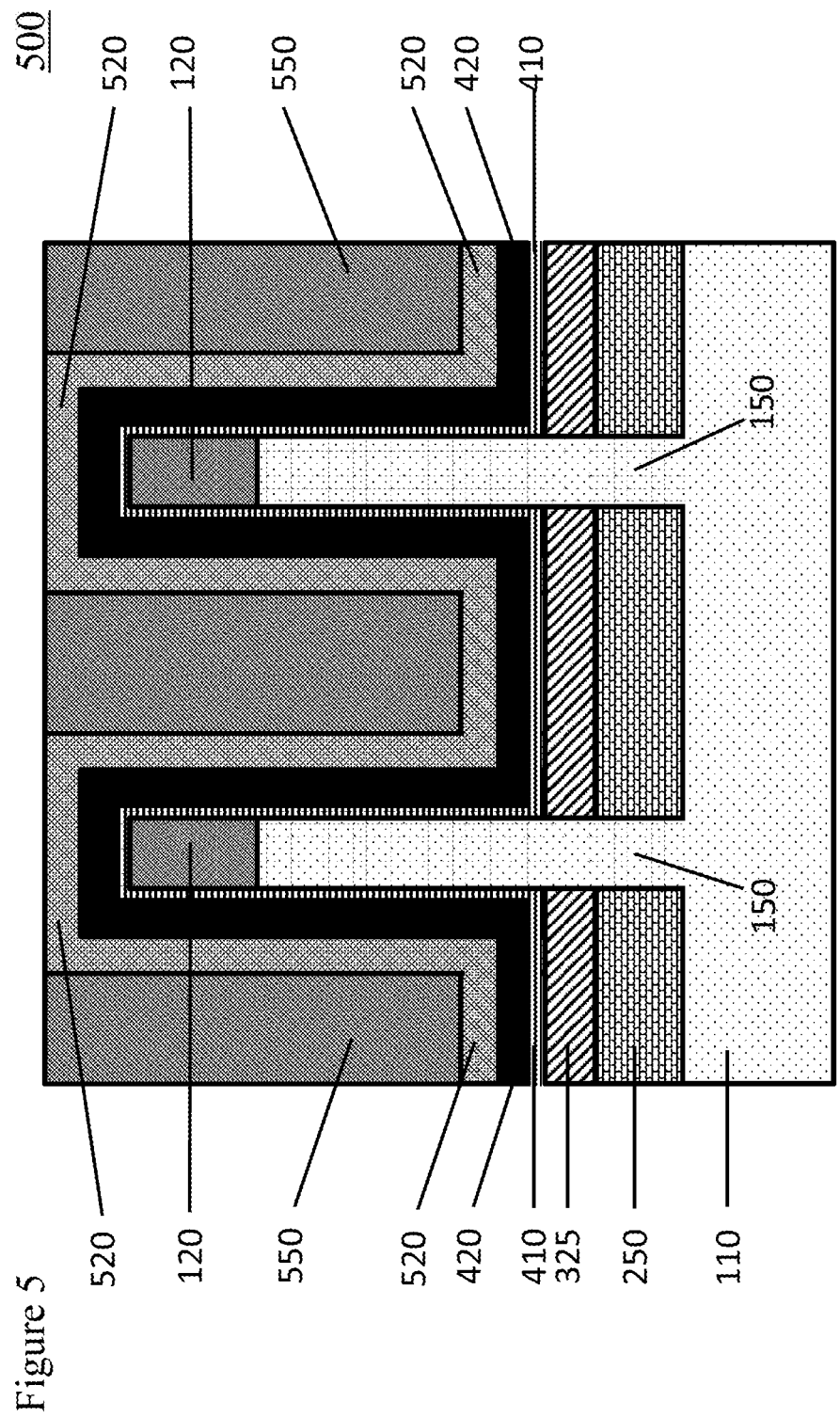
FIG. 5 is an elevation cross section view of an interim structure for a VFET after a conformally depositing a liner, filling with an insulator, and performing a chemical mechanical polishing.

FIG. 5 is an elevation cross section view of an interim structure 500 for a VFET after a conformally depositing a liner 520, filling the structure 500 with an insulator 550, and performing a chemical/mechanical polishing (CMP).

In an embodiment, the liner 520 is conformally deposited everywhere on the surface of the structure. The liner 520 covers the work function metal layer 420. The liner 520 is deposited by standard conformal deposition techniques, including but not limited to ALD and CVD. In the final structure, the liner 520 encapsulates the gate region and much of the top S/D region of the device.

In an embodiment, the liner 520 is made of SiN, SiBCN, or silicon carbo-oxide (SiCO).

A dielectric insulator 550 is then deposited to fill all the open volumes in the structure 500. In one embodiment the dielectric insulator is SiO2. The dielectric insulator 550 is deposited by any standard deposition technique including by not limited to ALD and CVD.

A CMP step follows that polishes down the top surface of the structure 500. The CMP stops on top of the SiN liner 520, making the top of the structure 500 co-planer with the top of the liner 520 which covers the fin 150, the high-k dielectric material 410, and the work function metal layer 420.

Figure 6:
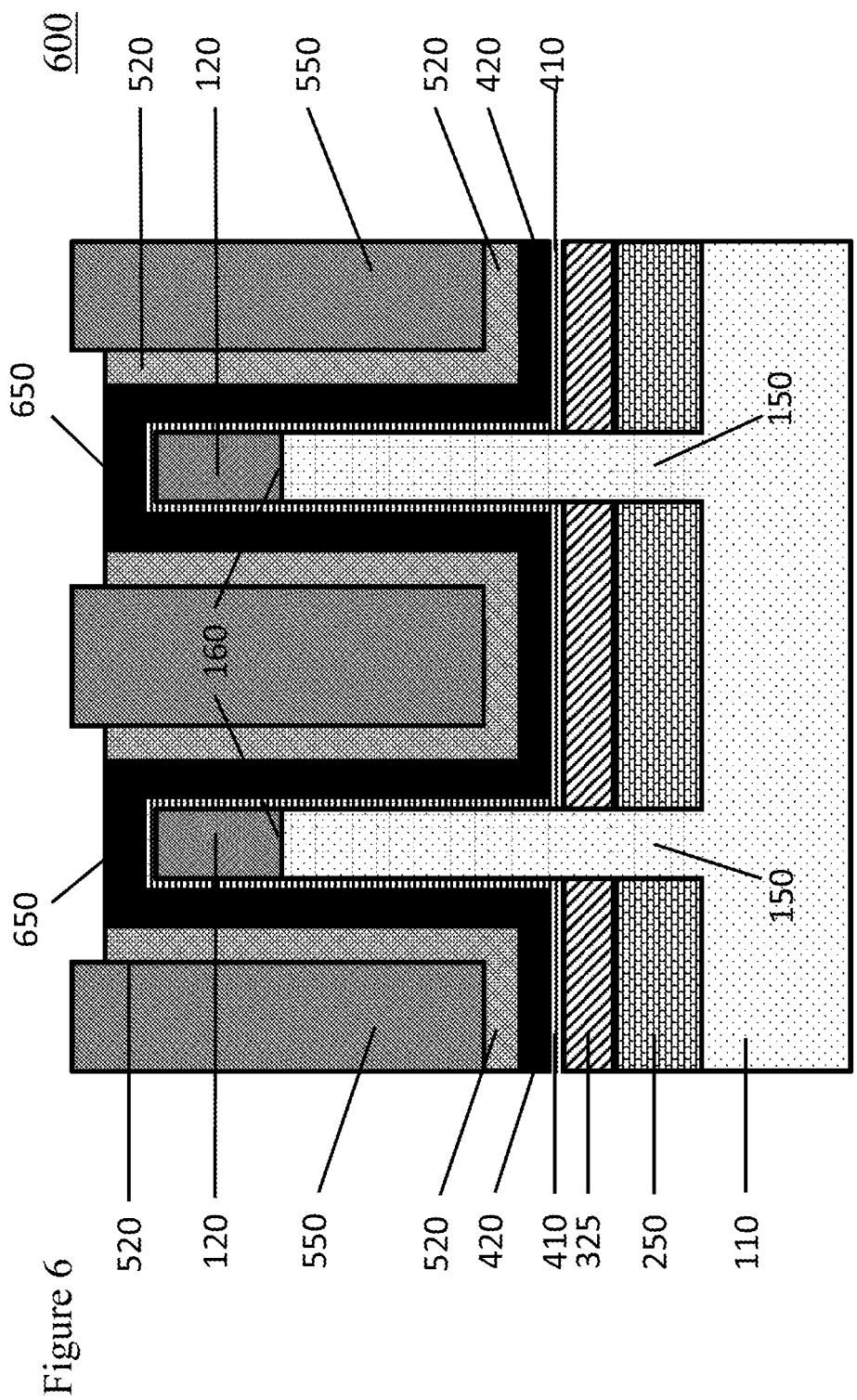
FIG. 6 is an elevation cross section view of an interim structure for a VFET after a selective reactive ion etching exposes the work function metal layer covering the fin end.

FIG. 6 is an elevation cross section view of one interim structure 600 for a VFET after a selective reactive ion etching exposes the top 650 of the work function metal layer 420 disposed on the top of the hard mask 120.

In an embodiment, a RIE is applied through a mask (not shown) to selectively remove the material in the liner 520 exposing the top 650 of the work function metal layer 420.

Figure 7:
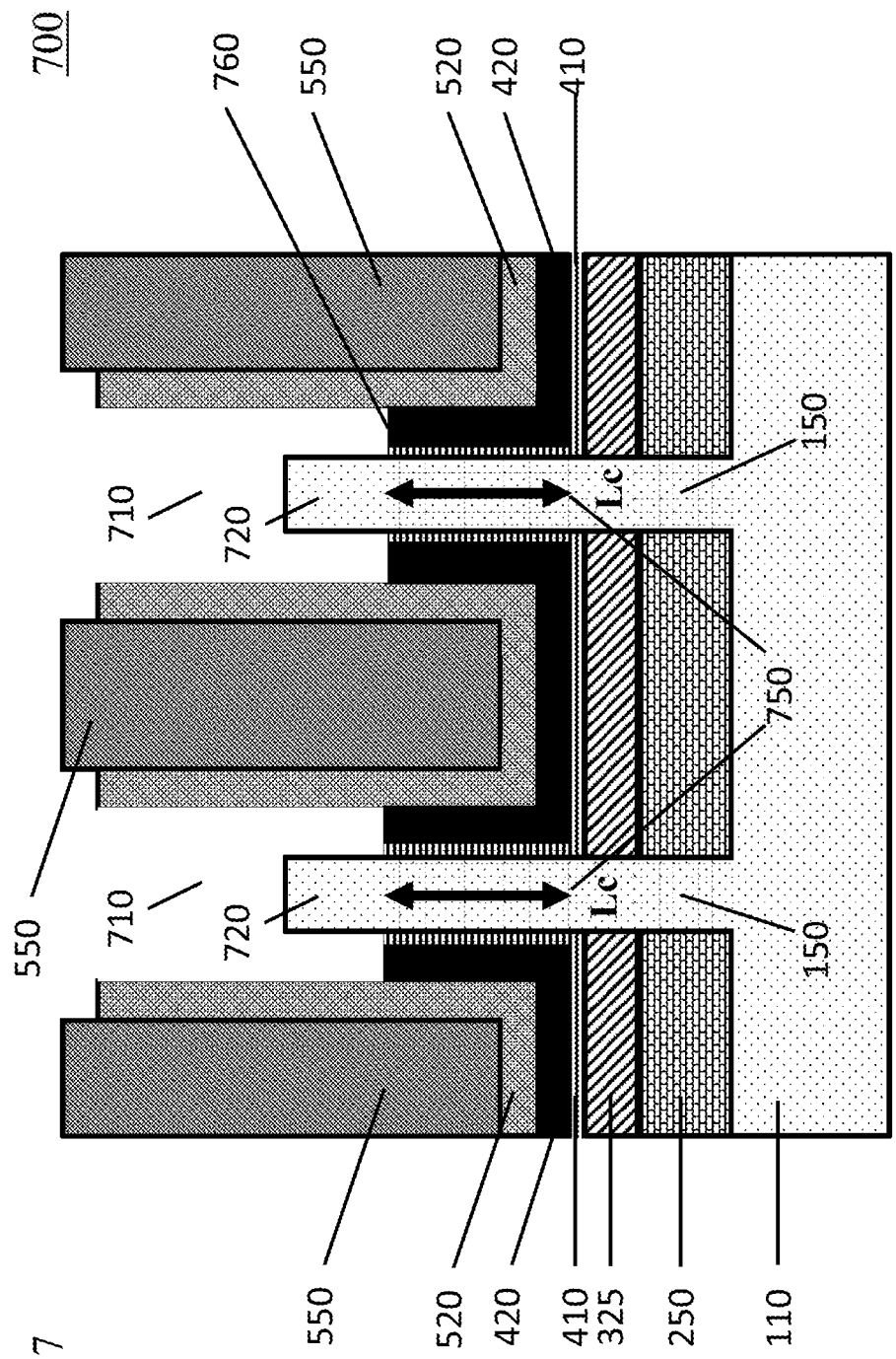
FIG. 7 is an elevation cross section view of an interim structure for a VFET after a portion of the work function metal and high-k layer is etch away defining a channel length.

FIG. 7 is an elevation cross section view of an interim structure 700 for a VFET after material is removed to define a channel 750 with channel length Lc and to create a void 710 above an exposed fin portion 720. The material removal comprises 3 steps: i. etching away a portion of the work function metal 420, ii. removing of some of the high-k material 410; and removing the hard mask 120.

An etch back process is applied to the exposed work function metal layer 420. In an embodiment, a "standard cleaning 1" (SC1) or dry HCl gas top-down etches back the work function metal 420 by continually removing the exposed, top surface, typically 760, of the work function metal layer 420 until the height of the work function metal layer 420 matches the desired height of the channel (750, Lc).

The rate of this etch back depends on the temperature, the surface area 760 of the top of the work function metal layer 420, and the chemistry of the etchant, e.g. SC1. An accurate conformal deposition thickness of the work function metal layer 420 corresponds with a precise exposed surface area 760 of the work function metal layer 420 exposed to the etch back. ALD deposition can control the work function metal layer 420 conformal thickness very accurately so all devices being made on the substrate 110 will have the same, or very similar, exposed surface area 760 in this step of the process. In addition, by controlling the time, temperature, and chemistry of the etch back, the work function metal layer 420 of each structure 700 should have the same resulting channel length, Lc, since the etch back rate should be the same for all structures 700 on the substrate 110. Using this method enables creation of a plurality of structures 700 with the same channel 750 length Lc and therefore the resultant devices will have similar electrical characteristics.

After the work function metal layer 420 exposed surface 760 is etched back from the top downward, a wet chemistry removes (pulls down) the exposed high-k dielectric layer 410 in locations left exposed by the removed work function metal layer 420. Standard wet chemistries can remove the high-k dielectric layer 410.

Then standard wet chemistries remove the hard masks 120 exposing the exposed fin portion 720 that includes the fin end 160 and an exposed portion of the fin sides 225 near the fin end 160.

The high-k dielectric layer 410 and work function metal layer 420 remaining to surround the channel 750 of the fin 150 is also called the gate area or gate region of the device.

Figure 8:
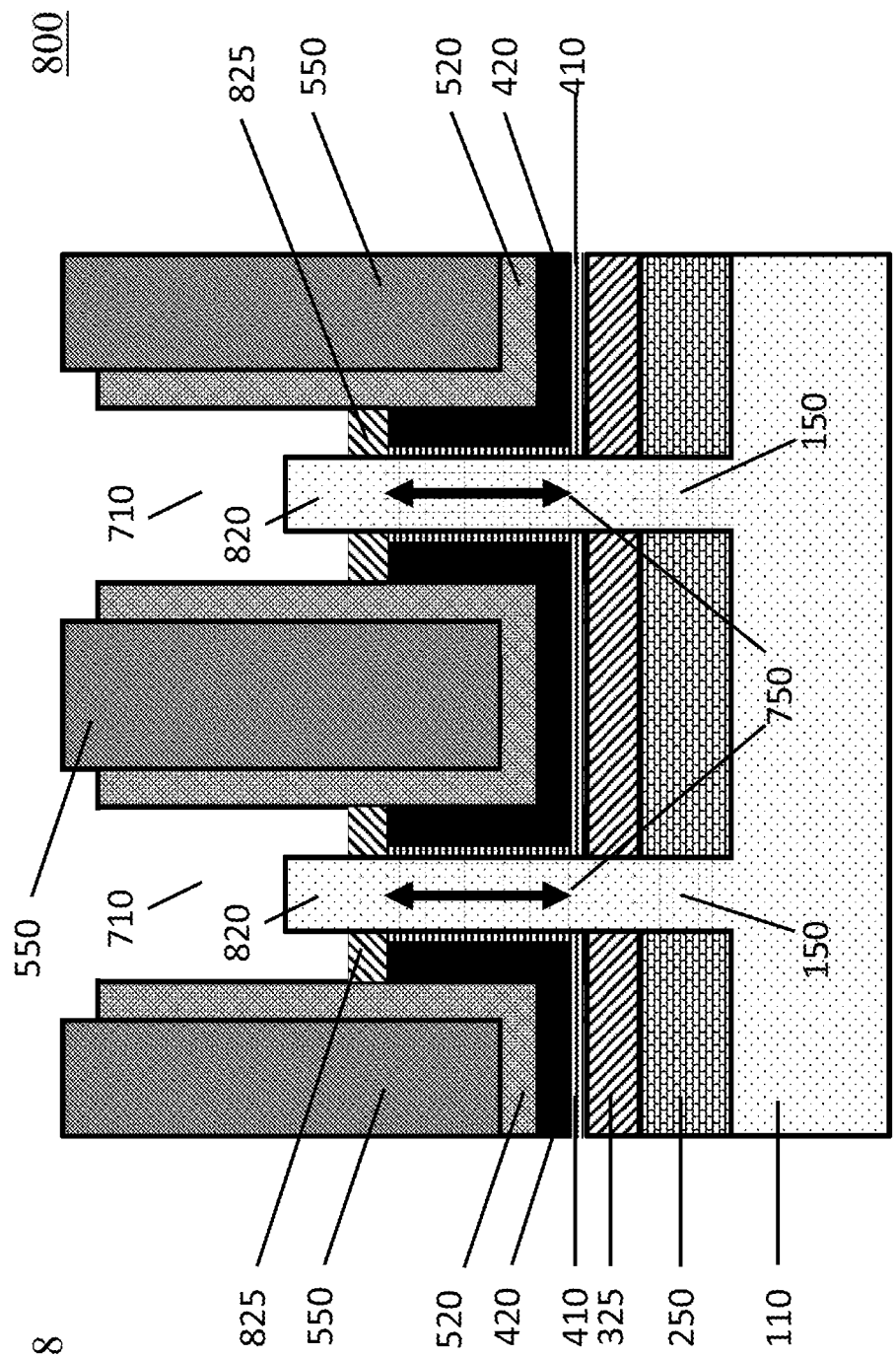
FIG. 8 is an elevation cross section view of an interim structure for a VFET after formation of a first top spacer.

FIG. 8 is an elevation cross section view of an interim structure 800 for a WET after formation of a first top spacer 825.

The first top spacer 825 performs several novel functions, including: i. increasing the distance between a larger surface area region of the top S/D (1250, below) and the gate cross section; ii. defining the closest distance between the top S/D 1250 and the gate cross section (e.g. surface 760); and iii. physically isolating a second top spacer 1025 (below) from the work function metal layer 420.

In an embodiment, the first top spacer 825 is deposited non-conformally with an initial thickness between 2 and 10 nm. An etch back step is performed to remove any non-conformally deposited first top spacer 825 material from the vertical surfaces, e.g. the vertical sides of liner 520 and/or the exposed side surfaces 225 of the fin 150. After etch back, the first top spacer 825 is thin enough to allow the fin end 160 to sit proud of the first top spacer 825 so both the fin end 160 and sides 225 of the fin 150 are exposed to enable growth of a dummy top S/D, as described below. The first top spacer 825 can have a thickness between 2 to 6 nm. In an embodiment the exposed fin portion 820 should be exposed between 2 to 10 nm above the top of the first top spacer 825.

In an embodiment, the non-conformal deposition of the first top spacer 825 is a high-density plasma (HDP) deposition. The etch back step can be done with any chemistry that selectively removes the first top spacer 825 material from the vertical surfaces. After the etch back step, the first top spacer 825 has a thickness between 2 and 6 nm.

In an embodiment, the first top spacer 825 is a dielectric material that contains no oxygen, e.g. the first top spacer 825 material is oxygen free. Oxygen free materials do not have oxygen to react with the work function metal layer 420 and high-k layer 410 at surface 760. For example, an oxygen containing first top spacer 825 can cause oxidation of the top surface 760 of the work function metal layer 420 and/or the high-k dielectric layer 410, creating an additional metal oxide layer adversely affecting device performance, e.g. shifting device Vth. In contrast, the first top spacer 825, made with oxygen free materials, acts as a barrier layer, keeping the second top spacer 1025 (below) electrically and physically separate from the work function metal layer 420 and the high-k dielectric layer 410.

In an embodiment, the first top spacer 825 is made of SiN, as one non-limiting example.

Figure 9:
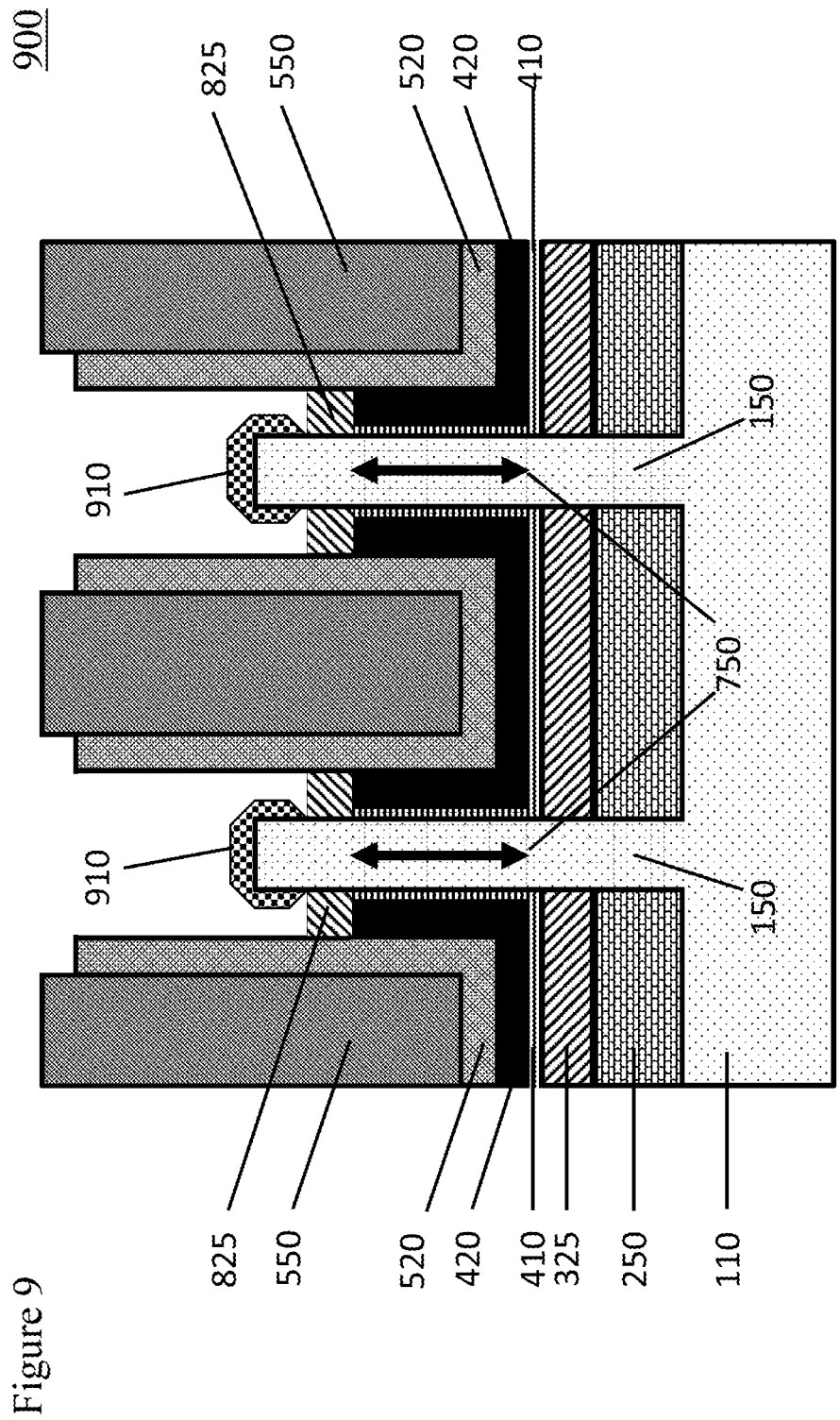
FIG. 9 is an elevation cross section view of an interim structure for a VFET after formation of a dummy top S/D.

FIG. 9 is an elevation cross section view of an interim structure 900 for a VFET after formation of a dummy top S/D 910.

The dummy top S/D 910 is grown by standard epitaxial growth techniques on the exposed fin portion 820 above the first top spacer 825. The dummy top S/D 910 is made of a material that is easily removed but allows a second top spacer to be formed and shaped around the dummy top S/D 910 geometry, as described below. The temperatures for this epitaxial growth are kept below the temperature constraints given the gate materials, e.g. the high-k dielectric layer 410 and work function metal layer 420, are already in place.

In an embodiment, that dummy top S/D 910 is made of SiGe. Alternative embodiments of dummy top S/D 910 material include any material which has etch selectivity of the fin 150 material can be used as well—e.g. Si and the dielectric materials used for the liner 520.

The dummy top S/D 910 undergoes a timed growth where the dummy top S/D 910 grows in a typical "diamond" crystalline structure, but the growth is stopped after a time. The time of the growth is enough to allow the dummy top S/D 910 to grow to a thickness of 2 to 8 nm. The dummy top S/D 910 covers the exposed fin portion 820 above the first top spacer 825. The dummy top S/D 910 does not have to be a uniform thickness.

Figure 10:
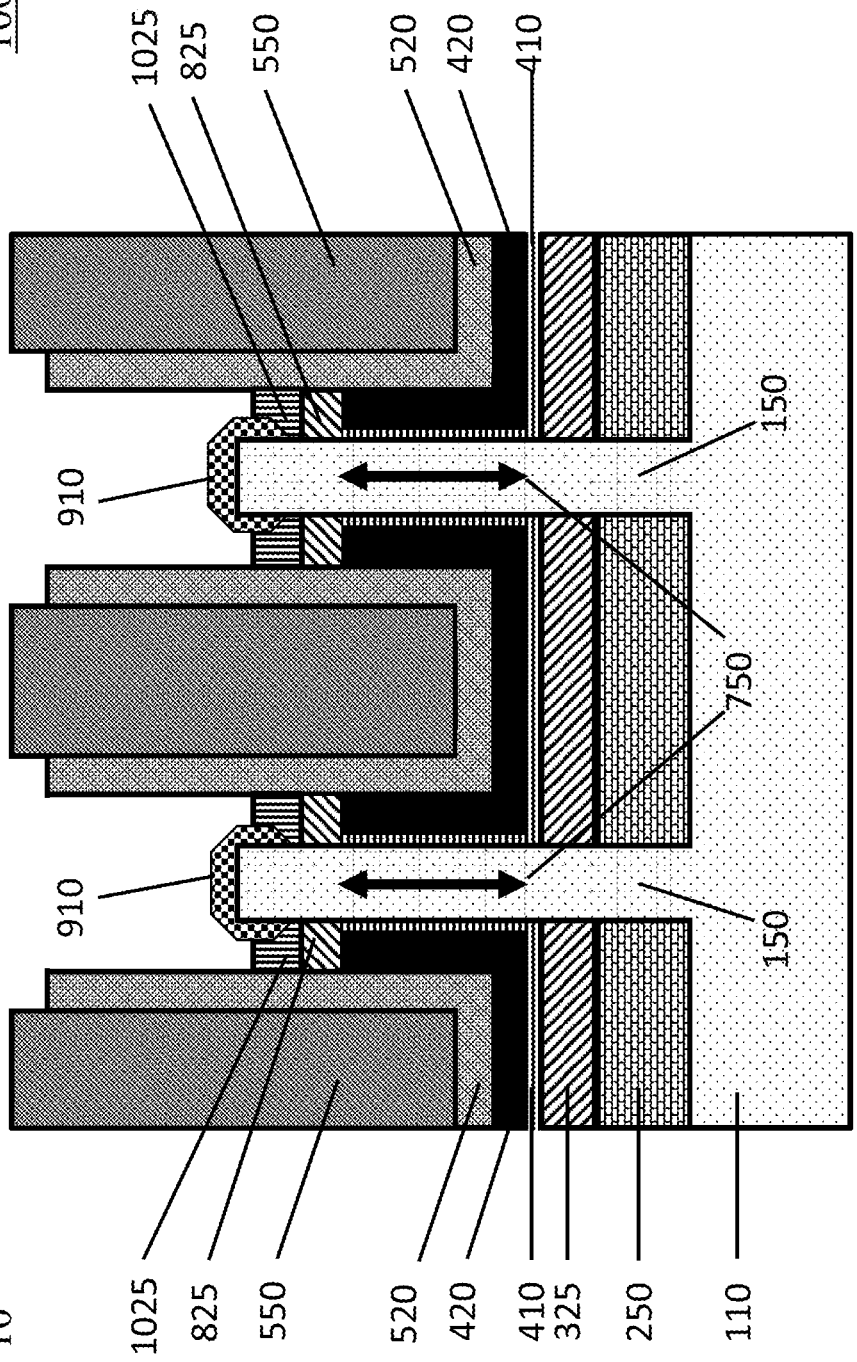
FIG. 10 is an elevation cross section view of an interim structure for a VFET after formation of a second top spacer.

FIG. 10 is an elevation cross section view of an interim structure 1000 for a VFET after formation of a second top spacer 1025.

In one embodiment, the second top spacer 1025 is deposited using a non-conformal deposition, e.g. a high-density plasma (HDP) deposition, followed by an etch-back process. As before, this process provides a thicker film deposition of about 10 nm in thickness on the top surface of the first top spacer 825 and a thin deposition (not shown) of about 2-3 nm in thickness on the vertical, interior sides of the liner 520. The thin deposition on the vertical sides of liner 520 is removed by the etch back step. A standard etch back process can be used, e.g. a wet etch back process. The final thickness of the second top spacer 1025 is between 2 to 6 nm.

In an alternative embodiment, the second top spacer 1025 is deposited using a conformal deposition followed by an etch-back process. The second top spacer 1025 material is conformally deposited over the surface of the first top spacer 825 by deposition techniques include but are not limited to: ALD, CVD, PECVD, RFCVD, PVD, PLD, LSMCD, and/or sputtering. Since the location of the second top spacer 1025 has a smaller opening than the open space above during the conformal deposition, larger amounts of material are deposited at the second top spacer 1025 location than on the vertical surfaces due to "pinch off"—the merging of material deposited on surfaces defining a small space. Accordingly, standard etch back processes, e.g. a wet etch back process, will remove any residual second top spacer 1025 material from the vertical, interior side surfaces of the liner 520 while still leaving material to create the second top spacer 1025. Therefore, the same second top spacer 1025 structure can be formed by using either conformal or non-conformal deposition.

In some embodiments, the second top spacer 1025 is made of a low-k dielectric material, including but not limited to: SiN, SiBN, SiBCN, SiOCN, SiCO, or SiO2.

Note the second top spacer 1025 material can contain oxygen because the first top spacer 825 provides a barrier between both the high-k dielectric layer 410 and work function metal layer 420 and the second top spacer 1025.

To reiterate, in some embodiments, the first top spacer 825 is between 2 to 6 nm in thickness and is made of a dielectric material which doesn't contains oxygen. The second top spacer 1025 is between 2 to 6 nm in thickness. Therefore, the combined thickness of the first and second top spacers is between 4 to 12 nm.

In an embodiment, the second top spacer 1025 has a lower dielectric constant, k, than the first top spacer 825. The lower k, in combination with its larger thickness, cause the second top spacer 1025 to reduce the parasitic capacitance between top S/D 1250 and gate region, as described in more detail below.

Since the dummy top S/D 910 covers the exposed fin portion 720 above the first top spacer 825, the material making the second top spacer 1025 cannot be disposed in this region.

Figure 11:
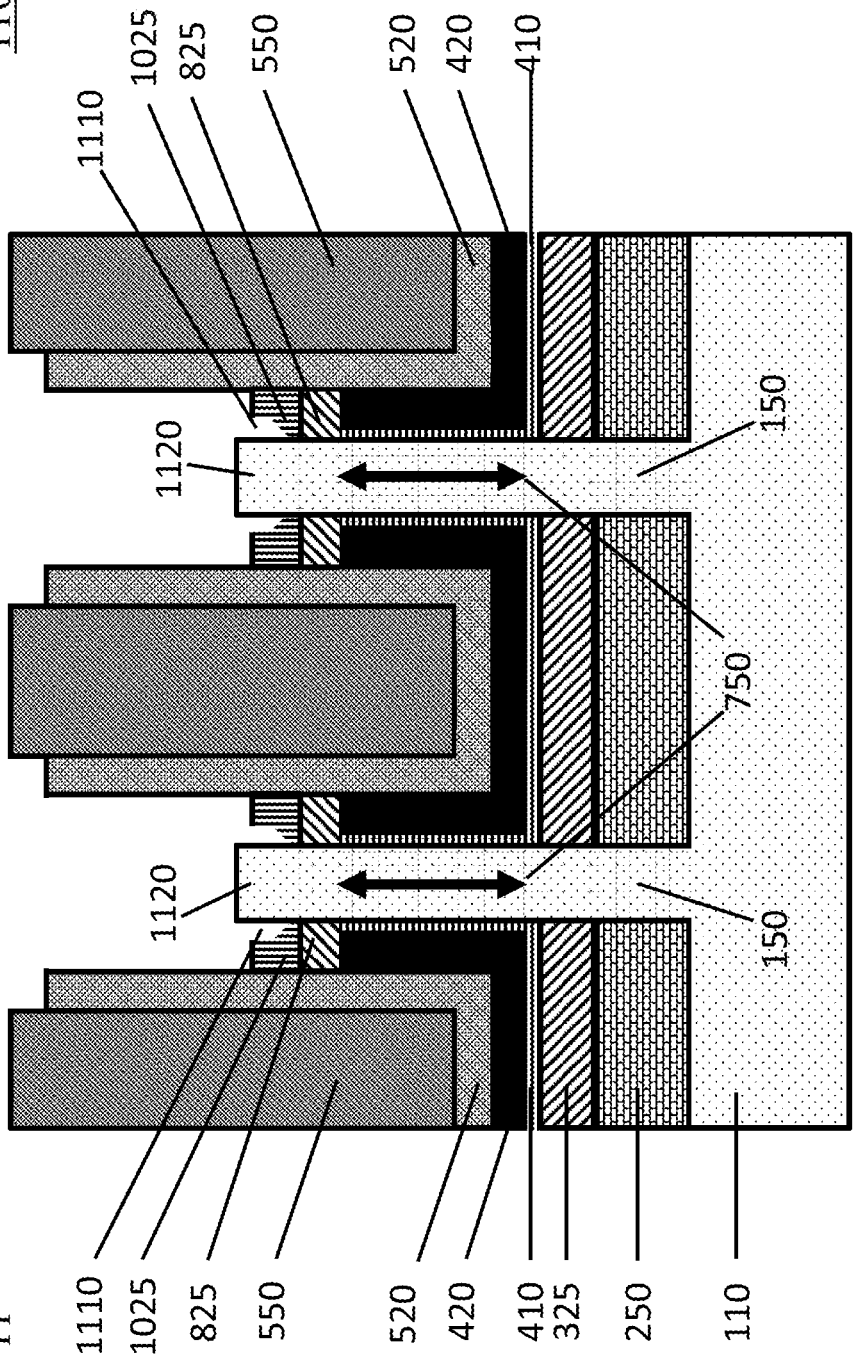
FIG. 11 is an elevation cross section view of an interim structure for a VFET after removal of the dummy top S/D.

FIG. 11 is an elevation cross section view of an interim structure 1100 for a VFET after removal of the dummy top S/D 910.

In an embodiment, the dummy top S/D 910, made of SiGe, is removed with a selective wet etch like a hot Standard Clean—1 (SC1). Alternatively, the SiGe dummy top S/D 910 can be removed by HCl gas.

After removal of the dummy top S/D 910, a gap 1110 remains in a re-exposed fin portion 1120. The re-exposed fin portion 1120 includes the fin end 160 and the exposed sides 225 of the fins not covered by materials, including the second top spacer 1025, after removal of the dummy top S/D 910. The gap 1110 is the part of the re-exposed fin portion 910 where the dummy top S/D 910 prevented deposition of second top spacer 1025 material along the fin sides 225. The gap 1110 (on each side of the fin 150) has a width equal to the thickness of the former dummy top S/D 910, i.e. between 2 to 8 nm.

Figure 12:
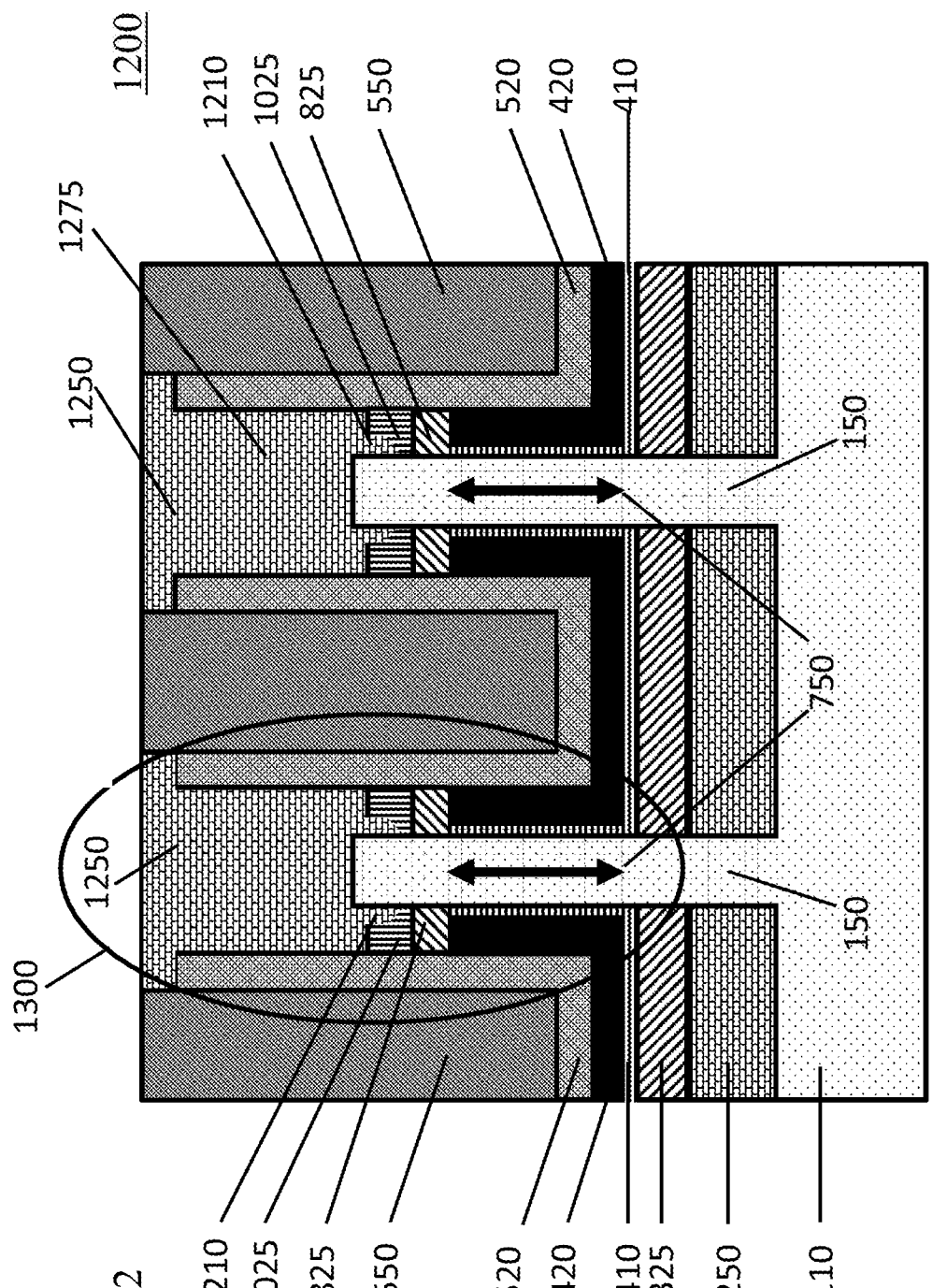
FIG. 12 is an elevation cross section view of one structure for a VFET after formation of a top S/D.

FIG. 12 is an elevation cross section view of one final structure 1200 for a VFET after growth of a top S/D 1250.

The top S/D 1250 is epitaxially grown on the top and exposed sides of the re-exposed fin portion 1120. In an embodiment, the top S/D is the same material and doping as the bottom S/D layer 250 and can be epitaxially grown the same way, as described above.

The top S/D 1250 grows into and fills the large void region 710 including the space between liner 520 and the dielectric insulator 550, to form a large volume S/D 1250 region 1275. The top S/D 1250 grows into and fills the gap region 1110 to form a small volume S/D 1250 region 1210.

Figure 13:
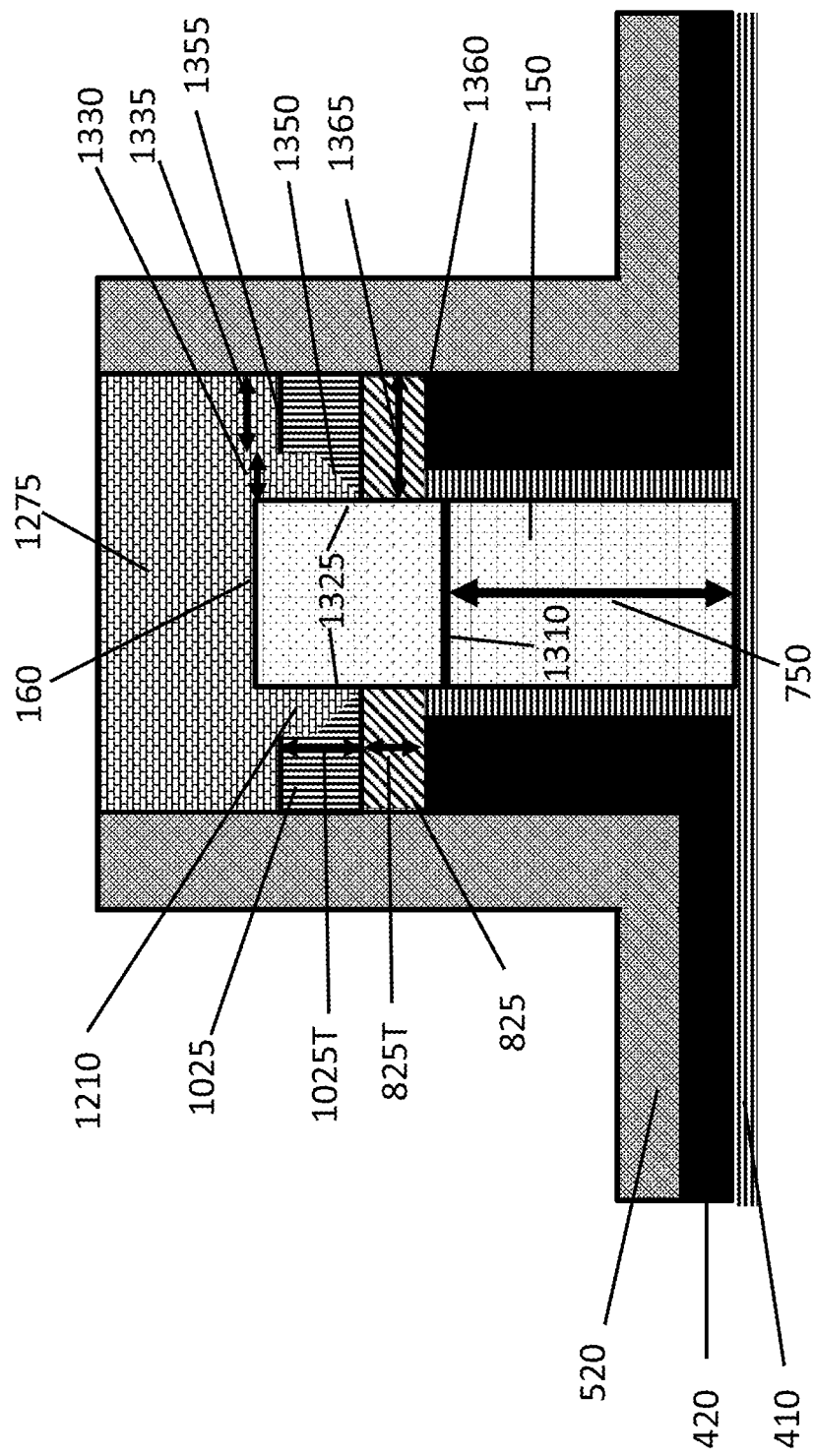
FIG. 13 is an illustration of some features of the invention that reduce parasitic capacitance.

Oval 1300 captures some of the elements of structure 1200 expanded in FIG. 13.

FIG. 13 is an illustration 1300 expanding a part of FIG. 12 and showing some features of the present invention that reduces parasitic capacitance while enabling good dopant diffusion from the top S/D 1250 into the fin 150 to form a junction 1310 defining the boundary between the top S/D 1250 and the channel 750. In an embodiment, the junction 1310 forms slightly below the first top spacer 825 so the junction 1310 is within the gate region and not encompassed by the first top spacer 825. Therefore, the dopants need only to diffuse a distance, about the thickness of the first top spacer 825, in order to form the junction 1310.

Capacitance is defined as:

$$C=Q/V$$

where C is measure in farads, Q is measured in coulombs, and V is measured in volts.

In structures with a dielectric separating two charged surfaces, capacitance is determined by:

$$C=k\,\varepsilon A/A$$

where C is the capacitance; A is the area of the (smaller of the two) charged surface; d is the distance of separation between the areas; E is the permittivity of air ($8.84 \times 10^{-12}$ farads/meter); and k, the dielectric constant, is the permittivity of the dielectric. Capacitance increases as the area and permittivity increase and capacitance decreases as the permittivity decreases and the distance of separation increases.

The work function metal layer 420 and the high-k layer 410 have a combined, cross sectional surface, e.g. a gate cross section surface area 1360 with a width 1365. (The area 1360 is the width across the surface 1365 times the length of the gate region along/around the fin 150.)

The top S/D 1250 comprises a larger volume top S/D 1250 first region 1275 and a smaller volume top S/D 1250 second region 1210 that together encompass the fin end 160 and fin exposed portion sides 1325. Both the fin end 160 and the fin exposed portion sides 1325 are physically, electrically, and chemically connected to the top S/D 1250.

The first top spacer 850 has a constant first top spacer thickness 825T as described above. The second top spacer 1025 has a second top spacer has a maximum thickness 1025T and a minimum thickness of zero next to the fin 150.

The first 850 and second 1025 top spacers surround the fin 150 and are in the volume between the fin exposed portion side 1325 and the liner 520. The thickness of the second top spacer 1025 has two thickness regions depending on the distance from the liner 520 and the fin exposed portion side 1325.

In the first top S/D region 1275, the second top spacer 1025 has an essentially constant thickness equal to the maximum thickness 1025T. The first region 1275 has a first region width 1335 measured from the liner 520 along the top spacer 1025. A first region area 1355 is determined by multiplying the first region width 1335 by fin length. The first region area 1355 is parallel to and a constant distance away (maximum thickness of 1025T plus the thickness 825T) from the gate cross section area 1360.

The first region area 1355 is, further from the fin 150 than the second region.

In the second region 1210, the second top spacer thickness 1025I varies from the maximum thickness of 1025T adjacent to the first region to zero thickness at the fin exposed portion side 1325. The second region 1350 has a width 1330 measured from the first region to fin exposed portion side 1325. The distance between the second region area 1350 increases in distance from the gate cross section area 1360 as the distance from the fin exposed portion side 1325 increases.

The sum of the first region width 1335 and second region width 1330 equals the total distance 1365 between the liner 520 and the fin exposed portion side 1325 which is also equals the width 1365 of the gate cross section area 1360.

Because the second region 1210 width 1330 and second region 1210 surface area 1350 are much less than the first region width 1335 and first region surface area 1355, the effects of the second capacitance are minimized even though part of the second region surface area 1350 area is closer to the gate cross section area 1360. The effects of the first capacitance are greatly reduced because the first region is a larger distance, e.g. equal to the sum of the maximum thickness 1025I and first top spacer thickness 825I over the entire first region area 1355. The sum of the maximum thickness 1025T and first top spacer thickness 825T is greater than 4 nm.

In addition, since the first and second capacitance are in parallel, the total stray capacitance is the sum of the first and second capacitance. Because the second region area 1350 is much smaller than the first region surface area 1355, there is a minimal increase in capacitance due to the addition of the second region 1210.

There are additional advantages to having the second region 1210, e.g. the region 1210 where the top S/D 1250 has contact with the exposed portion side 1325 of the fin 150 in addition to the contact made to the fin end 160. This increased boundary surface between the top S/D 1250 and the re-exposed fin portion 1120 allows more dopants to migrate from the top S/D 1250 into the fin, e.g. during an anneal step, when creating the junction 1310. Due to the increase boundary surface, dopant diffusion has less resistance. In addition, even though the majority of the top S/D 1250 is a larger distance from the channel 750, e.g. most of the top S/D 1250 is a distance equal to the sum of the first top spacer thickness 825T and the maximum second top spacer thickness 1025T, the dopants can minimize the distance diffused. By diffusing into the second region 1210, dopants can enter the fin 150 through the exposed portion side 1325, allowing a diffusion distance to the junction 1310 as short as the thickness of the first top spacer 825T or slightly more.

Further, the top S/D 1250 volume is not constrained because top S/D top 1275 occupies a relatively large volume between the liners 520. The epitaxial grow of the top S/D is only limited by the epitaxy, not a smaller volume constraining epitaxial growth. Further, this large volume enables an ample supply of dopants to diffuse into the fin during junction 1310 formation.

Figure 14:
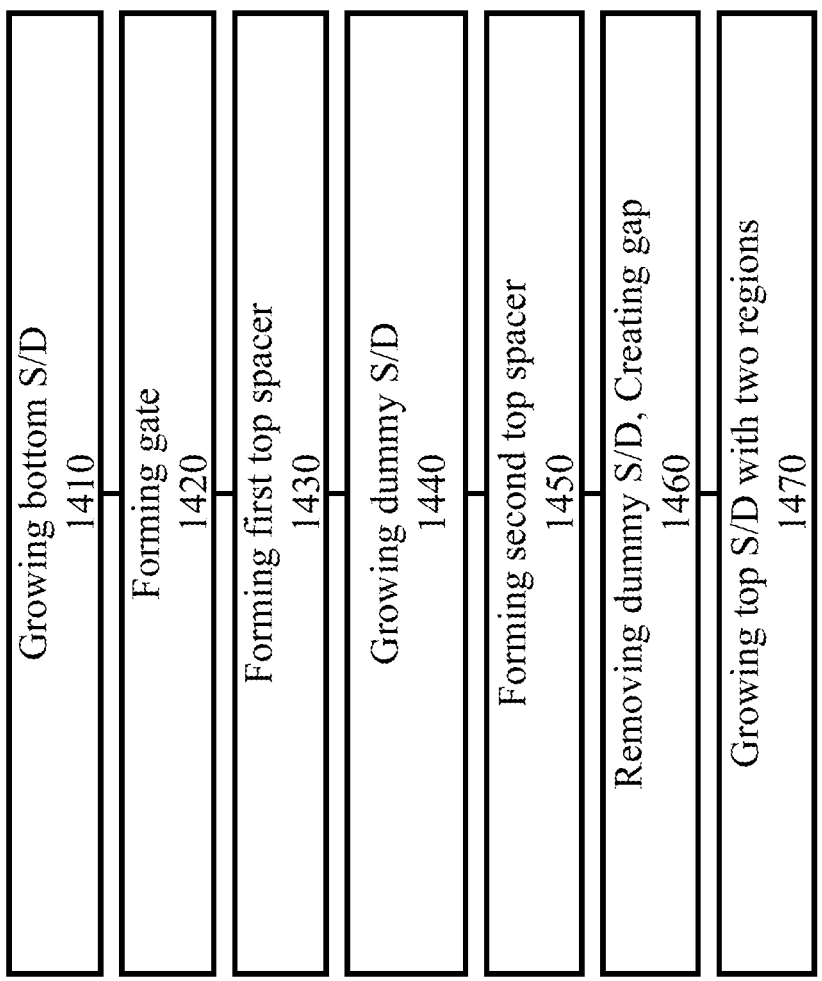
FIG. 14 is a flow chart of one process for making a VFET with reduced parasitic capacitance between the gate and top S/D.

FIG. 14 is a flow chart of a process 1400 for making a VFET with reduced parasitic capacitance between the gate and top S/D.

Step 1410 starts by growing a bottom S/D 250 on a substrate 110. The bottom S/D 250 surrounds the fin bottom 275. This step includes adding the bottom spacer 325. See description of FIGS. 2 and 3 above.

In step 1420, the gate is formed. This includes forming the high-k layer 410 and the work function metal layer 420. The liner 520 and the dielectric insulator fill 550 are also formed in this step. This includes steps like etch backs, pull down, etc. explained in the description of FIGS. 4 through 7 above.

In step 1430, the first top spacer 825 is formed as described in FIG. 8.

In step 1440, the dummy top S/D 910 is grown as described in FIG. 9.

In step 1450, the second top spacer 1025 is formed as described in FIG. 10.

In step 1460, the dummy top S/D 910 is removed leaving a gap 1110 around the re-exposed fin portion 1120.

In step 1470, the top S/D 1250 is grown with a first region 1210 and a second region 1275.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A vertical field effect transistor (VFET) comprising:
a bottom source/drain (S/D);
a fin having a vertical channel, a fin top, and a fin bottom, the fin being perpendicular to the bottom S/D, and the fin bottom being electrically, physically, and chemically connected to the bottom S/D;
a gate encompassing the vertical channel, the gate comprising a high-k dielectric layer disposed on the channel and a work function metal layer disposed on the high-k dielectric layer;
a first top spacer, the first top spacer having a first thickness, the first thickness being a constant thickness;
a second top spacer disposed on the first top spacer, the first top spacer between the gate and the second top spacer, and the first top spacer being a barrier between the second top spacer and the work function metal and high-k dielectric layers, the second top spacer having two thickness regions, a top spacer first region thickness with a constant and thicker thickness being further from the channel and a top spacer second region thickness with a thinner thickness being closer to the channel; and
a top S/D disposed on the second top spacer, the top S/D being electrically, physically, and chemically connected to the fin top, where the first thickness is between 2 to 6 nanometers (nm) and the top spacer first region thickness is between 2 to 6 nm.

2. A VFET, as in claim 1, where the first thickness is less than the top spacer first region thickness.

3. A VFET, as in claim 1, where the first top spacer is a dielectric material with a first dielectric constant and the second top spacer is a dielectric material with a second dielectric constant and the second dielectric constant is less than the first dielectric constant.

4. A VFET, as in claim 1, where the second top spacer is made of one of the following materials: dielectric nitrides (e.g., SiN), silicon boron nitride (SiBN), siliconborocarbonitride (SiBCN), silicon oxycarbonitride (SiOCN), silicon carbo-oxide (SiCO), and SiO2.

5. A VFET, as in claim 1, where the sum of the first and the top spacer first region thickness is greater than 4 nm.

6. A VFET, as in claim 1, where the top S/D and bottom S/D are doped with one of a p-type and n-type dopant.

7. A vertical field effect transistor (VFET) comprising:
a bottom source/drain (S/D);
a fin having a vertical channel, a fin top, and a fin bottom, the fin being perpendicular to the bottom S/D, and the fin bottom being electrically, physically, and chemically connected to the bottom S/D;
a gate encompassing the vertical channel, the gate comprising a high-k dielectric layer disposed on the channel and a work function metal layer disposed on the high-k dielectric layer, the gate having a gate cross section area;
a first top spacer, the first top spacer having a first thickness, the first top spacer disposed on the gate cross section area;
a second top spacer disposed on the first top spacer, the first top spacer being a barrier between the second top spacer and the work function metal layer, the second top spacer having two thickness regions, a top spacer first region thickness with a constant and thicker thickness being further from the channel and a top spacer second region thickness with a thinner thickness being closer to the channel; and
a top S/D disposed on the second top spacer, the top S/D being electrically, physically, and chemically connected to the fin top, where the top S/D has a first region further from the fin top and above the top spacer first region thickness and a second region closer to the fin top and above the top spacer second region thickness, the first region having a first region area and the second region having a second region area,
wherein a first capacitance is formed between the gate cross section area and the first region area and a second capacitance is formed between the gate cross section area and the second region area,
and wherein the first top spacer and second top spacer are disposed between the gate cross section area and the top S/D in the first region area and, in the first region area, the sum of the top spacer first region thickness and the first thickness are a constant and maximum thickness.

8. A VFET, as in claim 7, where a part of the top S/D extends into the top spacer and along the channel in the second region.

9. A VFET, as in claim 7, where the first top spacer and second top spacer are disposed between the gate cross section area and the second region area and the second top spacer has a varying thickness between a maximum thickness and zero thickness.

10. A VFET, as in claim 7, where the distance between the gate cross section area and the first region area is always greater than or equal to the distance between the gate cross section area and the second region area.

11. A VFET, as in claim 7, where the first capacitance is less than the second capacitance, even though the first region area is larger than the second region area.

12. A VFET, as in claim 7, where the second region contacts a side of the fin top so that dopants diffusing from the top S/D into the fin to form a junction between the top S/D and the channel need to diffuse within the fin a distance slightly more than the first thickness.

13. A VFET, as in claim 12, where the first thickness is between 2 and 6 nm.

* * * * *